US005563343A

United States Patent [19]
Shaw et al.

[11] Patent Number: 5,563,343
[45] Date of Patent: Oct. 8, 1996

[54] MICROELECTROMECHANICAL LATERAL ACCELEROMETER

[75] Inventors: Kevin A. Shaw; Scott G. Adams; Noel C. MacDonald, all of Ithaca, N.Y.

[73] Assignee: Cornell Research Foundation, Inc., Ithaca, N.Y.

[21] Appl. No.: 67,264

[22] Filed: May 26, 1993

[51] Int. Cl.⁶ .................................................. G01P 15/08
[52] U.S. Cl. ........................... 73/514.18; 73/514.24
[58] Field of Search ............................ 73/517 R, 514, 73/515, 516 R, 517 B, 514.18, 514.21, 514.24, 514.32, 514.35, 514.38, 514.36, 514.17

[56]                  References Cited

U.S. PATENT DOCUMENTS

| | | | |
|---|---|---|---|
| 3,835,338 | 9/1974 | Martin | 310/331 |
| 4,381,672 | 5/1983 | O'Connor et al. | 73/505 |
| 4,437,226 | 3/1984 | Soclof | 437/55 |
| 4,553,436 | 11/1985 | Hansson | 73/514.33 |
| 4,670,092 | 6/1987 | Motamedi | 156/643 |
| 4,685,198 | 8/1987 | Kawakita et al. | 437/73 |
| 4,706,374 | 11/1987 | Murakami | 437/225 |
| 4,746,621 | 5/1988 | Thomas et al. | 437/24 |
| 4,750,363 | 6/1988 | Norling | 73/517 R |
| 4,772,928 | 9/1988 | Dietrich et al. | 257/254 |
| 4,776,924 | 10/1988 | Delapierre | 156/647 |
| 4,845,048 | 7/1989 | Tamaki et al. | 437/62 |
| 4,851,080 | 7/1989 | Howe et al. | 156/647 |
| 4,867,842 | 9/1989 | Bohrer et al. | 156/647 |
| 4,945,765 | 8/1990 | Roszhart | 73/514.29 |
| 4,981,552 | 1/1991 | Mikkor | 156/647 |
| 5,045,152 | 9/1991 | Sickafus | 156/653 |
| 5,072,288 | 12/1991 | MacDonald | 257/420 |
| 5,095,752 | 3/1992 | Suzuki et al. | 73/514.32 |
| 5,121,180 | 6/1992 | Beringhause et al. | 73/514.34 |
| 5,126,812 | 6/1992 | Greiff | 257/417 |
| 5,149,673 | 9/1992 | MacDonald et al. | 437/192 |
| 5,179,499 | 1/1993 | MacDonald et al. | 361/313 |
| 5,198,390 | 3/1993 | MacDonald et al. | 437/203 |
| 5,205,171 | 4/1993 | O'Brien et al. | 73/514.18 |
| 5,228,341 | 7/1993 | Tsuchitani | 73/517 R |
| 5,235,187 | 8/1993 | Arney et al. | 250/306 |
| 5,314,572 | 5/1994 | Core | 156/643 |
| 5,345,824 | 9/1994 | Sherman | 73/517 R |
| 5,353,641 | 10/1994 | Tang | 73/514.18 |
| 5,357,803 | 10/1994 | Lane | 73/514.18 |

OTHER PUBLICATIONS

Accelerometer's Micromachined Mass "Moves" In Plane of IC; On-Chip Circuit Controls It And Senses G With Force-Balance Techniques. Airbags Boom When IC Accelerometer Sees 50G. Electronic Design, Aug. 8, 1991, pp. 45–56.
Zhang et al., "A RIE Process for Submicron, Silicon Electromechanical Structures", IOP Publishing Ltd., 1992, pp. 31–38.
Wilson et al., "Highly Selective, High Rate Tungsten Deposition", Materials Research Society, 1985, pp. 35–43.
Zhang et al. "An RIE Process for Submicron, Silicon Electromechanical Structures", IEEE, May 24, 1991, pp. 520–523.
Arney et al., "Formation of Submicron Silicon-on-Insulator Structures by Lateral Oxidation of Substrate-Silicon Islands", J. Vac. Sci. Technol. B 6(1), Jan./Feb. 1988, pp. 341–345.
Payne, R. S., et al. "Surface Micromachined Accelerometer: A Technology Update". SAE International, pp. 127–135 (Feb. 25–Mar. 1, 1991).

*Primary Examiner*—Hezron E. Williams
*Assistant Examiner*—Christine K. Oda
*Attorney, Agent, or Firm*—Jones, Tullar & Cooper, P.C.

[57]                   ABSTRACT

A microelectromechanical accelerometer having submicron features is fabricated from a single crystal silicon substrate. The accelerometer includes a movable portion incorporating an axial beam carrying laterally-extending high aspect ratio released fingers cantilevered above the floor of a cavity formed in the substrate during the fabrication process. The movable portion is supported by restoring springs having controllable flexibility to vary the resonant frequency of the structure. A multiple-beam structure provides stiffness in the movable portion for accuracy.

52 Claims, 5 Drawing Sheets

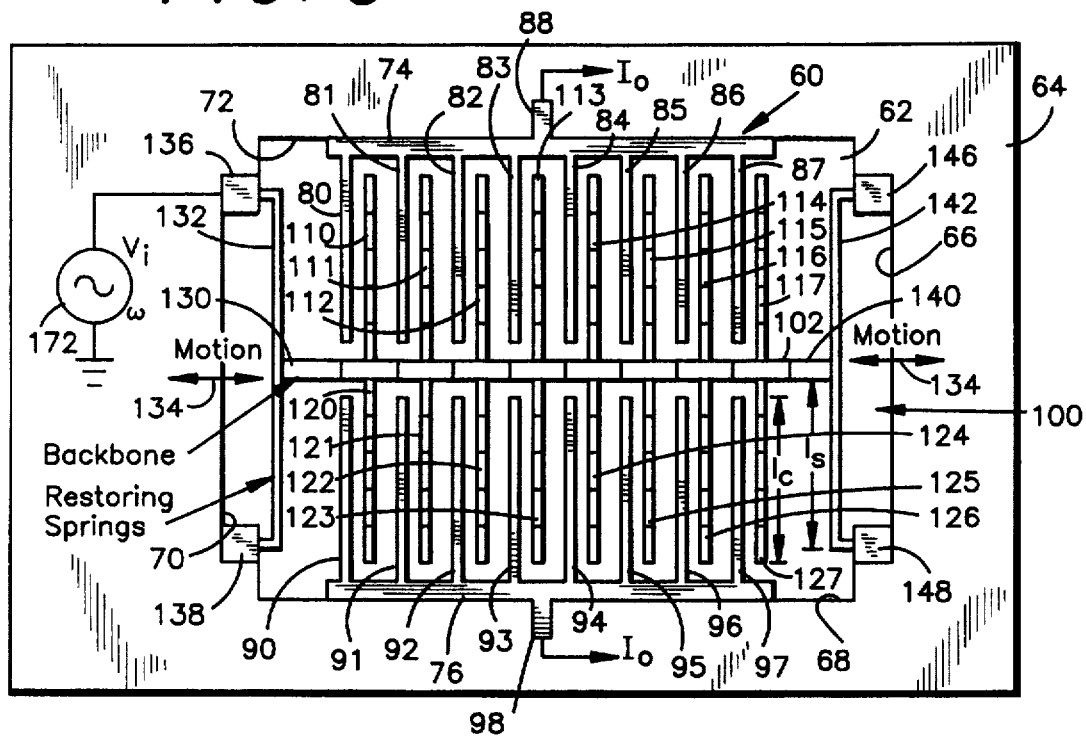

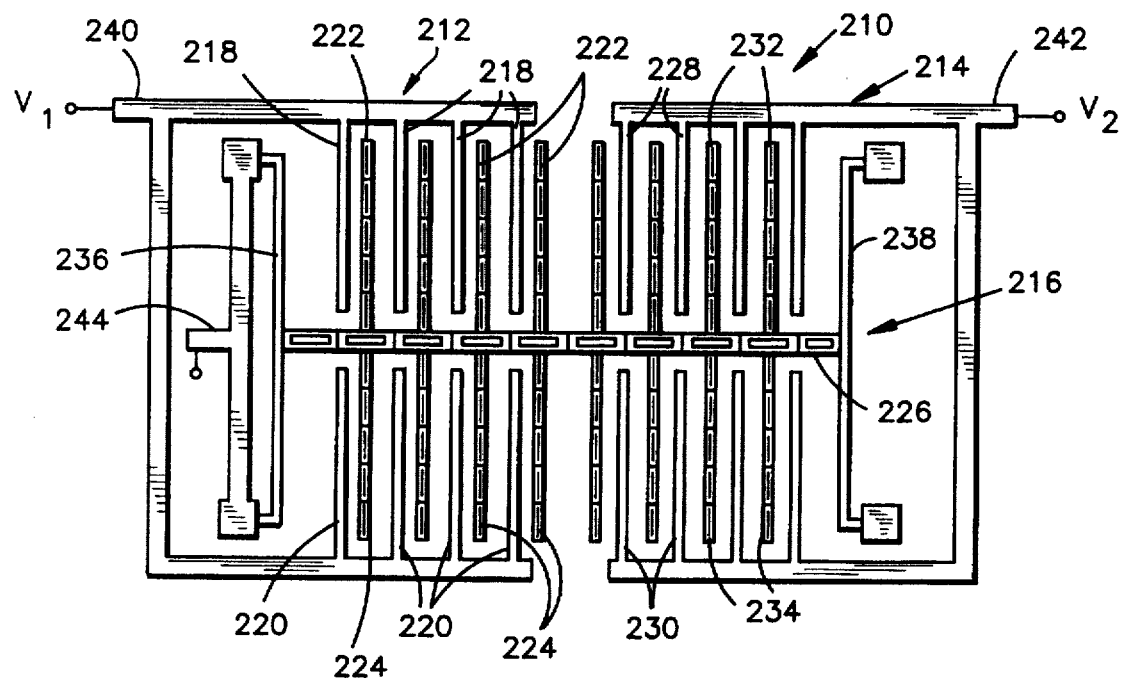
FIG. 10
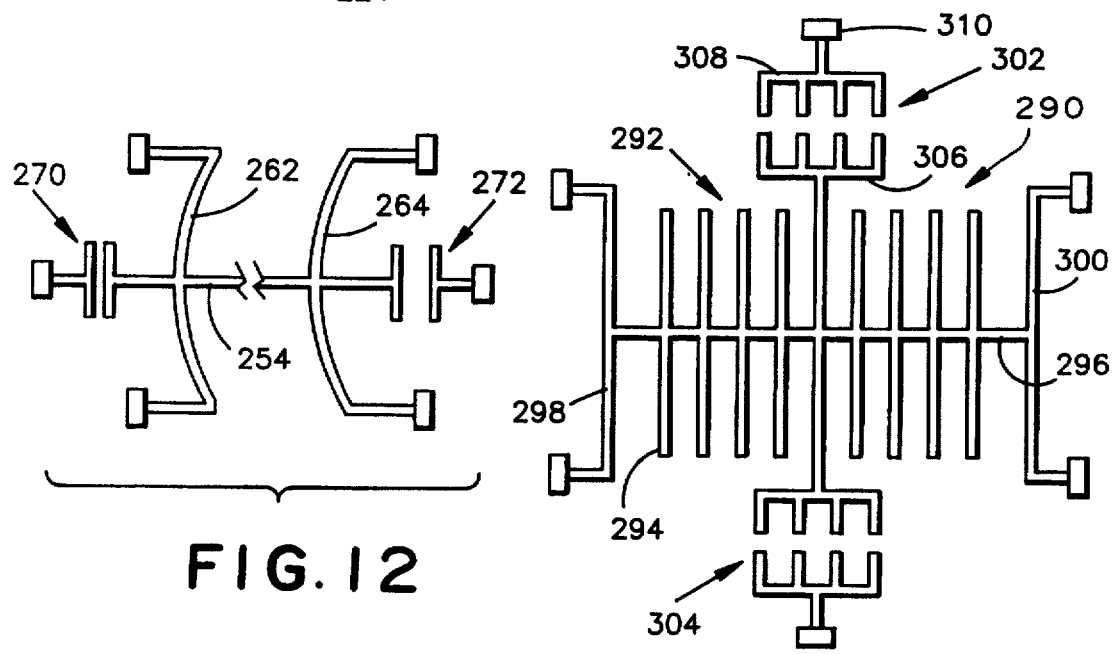
FIG. 12
FIG. 13

MICROELECTROMECHANICAL LATERAL ACCELEROMETER

BACKGROUND OF THE INVENTION

The present invention relates, in general, to microelectromechanical accelerometers and more particularly to accelerometers fabricated from single crystal silicon beams having high aspect ratios for high sensitivity, and to a method for fabricating such devices.

Various techniques and processes have been devised for fabricating micromachined structures such as accelerometers, and these prior techniques have been discussed in the literature. However, most such processes require multiple masking steps, wafer-to-wafer bonding, or the use of wet chemistry. It has been found, however, that the use of such multiple masks and bonding techniques can introduce alignment errors which reduce yield and increase. device cost, making such processes unsuitable for sub-micron structures.

In addition, prior accelerometers have presented problems in that they have required a relatively large amount of power for operation, and this is not suitable for microelectromechanical devices. For example, accelerometers have been developed which utilize a solid block of material as the proof mass, with piezoelectric supports for the block connected in a bridge circuit. Such devices can require as much as 2 milliamps of current for operation.

SUMMARY OF THE INVENTION

It is, therefore, an object of the present invention to provide improved microelectromechanical accelerometer structures.

It is a further object of the invention to provide accelerometer structures fabricated by a process which provides submicron feature sizes and high aspect ratios to permit a close spacing of relatively movable parts and which results in high sensitivity.

It is another object of the present invention to provide microelectromechanical accelerometer structures having relatively movable component parts having submicron dimensions and having control mechanisms for regulating the motion therebetween to reduce mechanical resonance and to thereby provide improved accuracy.

A still further object of the invention is to provide a microelectromechanical accelerometer which requires low current and power for operation, and which provides a high degree of sensitivity.

Briefly, the present invention is directed to an accelerometer which includes three major components: a central, or proof, mass, an adjacent capacitive sensor, and a restoring spring. The central mass, which is relatively movable with respect to the sensor, includes a longitudinally extending beam which forms a primary support, or backbone, for a plurality of parallel, laterally extending fingers lying in a common plane. This central mass will be referred to herein as the movable portion of the accelerometer. The fingers extending from the longitudinal beam are interleaved with corresponding parallel fingers forming an adjacent sensor, these sensor fingers being connected to a support such as a substrate adjacent the location of the longitudinal support beam structure and lying in the plane of the movable fingers. The sensor fingers and support will be referred to herein as the fixed portion of the accelerometer. The longitudinal support beam extends axially along the accelerometer, and is supported at each end by the restoring spring structure which tends to maintain the support beam in a rest location with respect to the fixed sensor structure and restrains the motion of the support beam.

The laterally extending movable fingers form movable capacitor plates which face corresponding opposed sensor capacitor plates on the stationary interleaved fingers. When the structure is subject to an acceleration force having a component in a direction parallel to the backbone, each movable finger tends to move toward or away from the adjacent fixed sensor finger under the restraint of the support spring structure. This motion results in a variable capacitance between adjacent opposed plates which is used to measure the relative displacement of the backbone structure.

In a preferred form of the invention, the support beam and its laterally extending fingers are double beam structures which are two orders of magnitude stiffer than the restoring springs which support the structure. Furthermore, the support beam and the movable and the stationary fingers have a high aspect ratio so that they are relatively stiff in the vertical direction. This high aspect ratio also provides large capacitor surfaces for the fingers, while the double beam structure provides the mass required for efficient operation as an accelerometer. If desired, additional mass can be added to the movable portion of the structure.

The restoring springs which support the movable structure of the accelerometer preferably each have a single beam structure. The springs extend laterally with respect to the backbone and are relatively flexible so as to permit longitudinal motion of the backbone through bending of the springs in the horizontal plane. The support springs have a high aspect ratio to provide stability in the vertical direction while allowing mechanical compliance in the horizontal plane, while the double beam structure and the lateral extension of the spring support beams provide stiffness in the lateral direction. The spring constants of the support springs can be adjusted electromechanically or electrically so as to adjust the resilience of the accelerometer moving structure to thereby adjust the bandwidth of frequencies to which it can respond and to vary its resonant point.

The accelerometer structure is fabricated utilizing a modified version of the Single Crystal Reactive Etching And Metalization (SCREAM-I) process which is described in U.S. application Ser. No. 08/013,319, filed Feb. 5, 1993, now abandoned, and its continuation U.S. application Ser. No. 08/312,797 filed Sept. 27, 1994, which application is hereby incorporated herein by reference. As stated in that application, the SCREAM-I process is a single mask, single wafer, dry etch process which uses optical lithography for fabricating submicron microelectromechanical devices. In accordance with the teachings of that application, a silicon dioxide layer is deposited on a single crystal silicon wafer, this oxide layer serving as the single etch mask throughout the process. Photolithography is used to pattern a resist, and then dry etching, such as magnetron ion etching, is used to transfer the pattern of the accelerometer structure into the oxide. Once the resist material is removed, the patterned oxide masks the silicon substrate to allow a deep vertical silicon RIE on exposed surfaces to produce trenches having predominately vertical side walls and which define the desired structure. Next, a conformal coating of PECVD oxide is deposited for protecting the side walls of the trenches during the following release etch. The trench bottom oxide is removed within an isotropic RIE, and a second deep silicon trench etch deepens the trenches to expose the side wall silicon underneath the deposited side wall oxide. The exposed silicon underneath the defined structure is etched away, using an isotropic dry etch such as an SF6 etch to release the structure and leave cantilevered beams and fingers over the remaining substrate. In the SCREAM-I process, aluminum is deposited by sputtering to coat the side walls of the released beams and fingers to thereby form the capacitor plates for the accelerometer of the present invention.

In the modified process of the invention, prior to the sputtering of aluminum, an etching step is used to open vias leading to contact pads formed in the surrounding substrate and covered by a layer of oxide, which vias can be used in connecting the accelerometer components to external circuitry. Thereafter, the sputtering step covers the entire top surface with aluminum, which also contacts the exposed pads. Finally, the aluminum is masked, patterned and etched back so that the aluminum provides connections between the pads and corresponding circuit elements.

Devices constructed in accordance with the foregoing process have extremely small dimensions, high aspect ratios, and can provide released, movable metal-coated structures closely adjacent to corresponding metal-coated stationary structures, whereby relative movement can be detected by the capacitance between opposed surfaces. The close spacing of the opposed fingers provides high sensitivity, while the modified SCREAM process permits fabrication of such devices on existing integrated circuits for interconnection with existing circuitry. The photolithographic step allows fabrication of a variety of accelerometer shapes as well as the formation of control structures for use in regulating the motion of the released accelerometer. Although axial motion of the movable structure is of primary importance, a modification of the process allows the deposition of metal on the substrate surface beneath the beams so as to permit detection of, as well as control of, vertical motion of the released structure with respect to the fixed fingers.

BRIEF DESCRIPTION OF THE DRAWINGS

The foregoing, and additional objects, features and advantages of the present invention will become apparent to those of skill in the art from a consideration of the following detailed description of preferred embodiments thereof, taken in conjunction with the accompanying drawings, in which:

FIG. 6 is a diagrammatic top plan view of a preferred embodiment of the accelerometer structure of the present invention;

FIG. 7 is an enlarged perspective view of a portion of the structure of FIG. 6;

FIG. 10 is a diagrammatic top plan view of a third embodiment of the invention;

FIG. 12 is a partial top plan view of the embodiment of FIG. 11, illustrating the effect of an accelerating force on the control of FIG. 11;

FIG. 13 is a diagrammatic top plan view of a fifth embodiment of the invention, illustrating a modified control structure;

DESCRIPTION OF THE PREFERRED EMBODIMENTS

Figure 1:
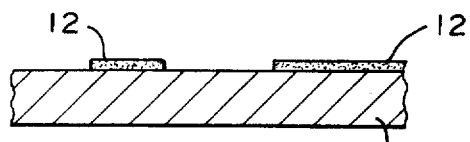
FIGS. 1–5 are diagrammatic illustrations of a fabrication process in accordance with the present invention.
Figure 2:
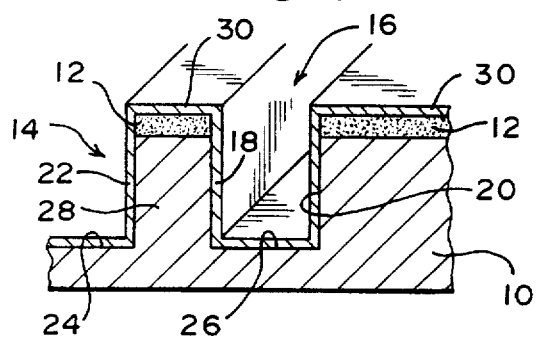

Capacitance-based accelerometers are fabricated, in accordance with the present invention, utilizing a modified version of the process known as Single Crystal Reactive Etching And Metalization (SCREAM-I), which is a low temperature, single-mask bulk micromachining process which permits construction of high aspect ratio single crystal silicon beams. The SCREAM-I process, which is diagrammatically illustrated in FIGS. 1–5, begins with a single crystal silicon wafer 10 which provides the substrate in which the accelerometer is to be constructed. The wafer may be a 1 mohm cm arsenic silicon, for example, on which is deposited a PECVD silicon dioxide layer 12. This oxide layer serves as the etch mask throughout the fabrication process. Photolithography is used to pattern a resist, and then magnetron ion etching is used to transfer the pattern into the oxide, FIG. 1 illustrating a simple patterned oxide layer.

After the foregoing pattern transfer, the resist is removed and the patterned oxide 12 serves as a mask for a deep vertical silicon trench etch. This step, which may be an RIE process which uses a mixture of chlorine and boron trichloride, etches the substrate 10 in the exposed regions around the mask 12 to produce corresponding trenches such as those illustrated at 14 and 16 in FIG. 2. The trenches are defined by substantially vertical side walls such as the side walls 18 and 20 which define trench 16 and the side wall 22 which defines one side of trench 14. Generally horizontal floor surfaces 24 and 26 are formed in trenches 14 and 16 by this step. The ratio of the silicon etched depth to sidewall widening is typically 40 to 1 and etch selectivity (i.e., the ratio of the silicon etch rate to the oxide etch rate) is typically 20 to 1. This allows formation of deep trenches defining mesas, such as the mesa 28 in FIG. 2, in any desired pattern as established by the mask 12.

After formation of the trenches, a conformal coating of PECVD oxide 30 is deposited to protect the side walls of the trenches during the subsequent release etch. Thereafter, the PECVD oxide layer 30 is removed from the trench bottoms to expose floors 24 and 26, by means of an isotropic RIE using, for example, $CF_4$. Thereafter, a second deep silicon trench etch using, for example, $Cl_2$ RIE deepens the trenches 14 and 16, as illustrated at 32 and 34, respectively, to expose the silicon substrate 10 below the protective oxide layer 30 on the side walls. This exposes silicon sidewall portions 36 and 38 on opposite sides of the mesa 28 and side wall 40 on the substrate portion surrounding the trenches and mesas formed by the pattern 12.

Figure 4:
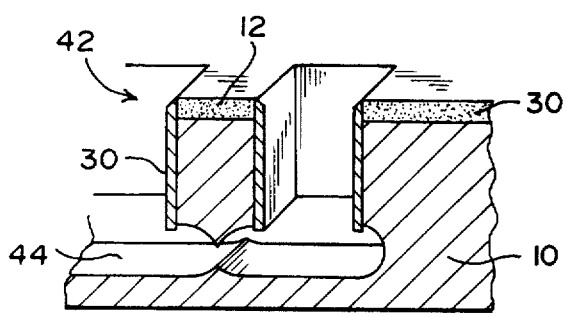

As illustrated in FIG. 4, the next step is to etch away the exposed silicon underneath the oxide layer 30 to thereby release the mesa 28 to form a beam such as that illustrated at 42 in FIG. 4. This release step is carried out by means of an isotropic $SF_6$ etch which releases the structure from the underlying substrate. The beam 42 may be cantilevered from the side wall, as illustrated in FIG. 4, or may be supported by suitable posts extending from the floor 44 of the trenches upwardly to the beam.

Following the release step, a layer of aluminum 46 (FIG. 5) is applied, as by sputter deposition, to coat the side walls of the released beam and the adjacent substrate. This deposition also provides a coating 48 on the floor of the trenches which are beneath, and spaced from, the released beam. The undercutting effect of the release etch step, which is illustrated at 50 in FIG. 5, electrically isolates the layer 48 on the floor of the trenches from the side wall coating 46. The aluminum coating can be selectively etched to provide suitable electrical isolation so that the coating on the side walls of the beam and on the substrate can act as capacitor plates in the accelerometer. The silicon in the beam 42 serves as the mechanical support for the corresponding capacitor plate.

In typical integrated circuit wafers, in which the accelerometer of the present invention preferably is incorporated, contact pads are provided for use in connecting the accelerometer to surrounding circuitry. The contact pads are metal, typically aluminum, formed on an oxide insulating layer on the substrate top surface and covered by a protective oxide layer. The modified fabrication process of the present invention takes advantage of such contact pads for interconnecting the accelerometer to the circuitry on the substrate by interposing a second masking and etching step prior to the sputter deposition step illustrated in FIG. 5. This second masking step, which utilizes a resist layer and photolithography, locates the contact pads so that a following etch step through the oxide protective layer opens vias to them.

After the vias are opened, the sputter deposition step applies an aluminum layer which contacts the pads through the vias. Thereafter, a third masking step is used to etch away undesired aluminum to thereby provide conductive paths from the sidewall capacitive plates to the contact pads on the surrounding substrate, and from there to the circuitry on the substrate for providing control potentials and for sensing the motion of the accelerometer.

Figure 5:
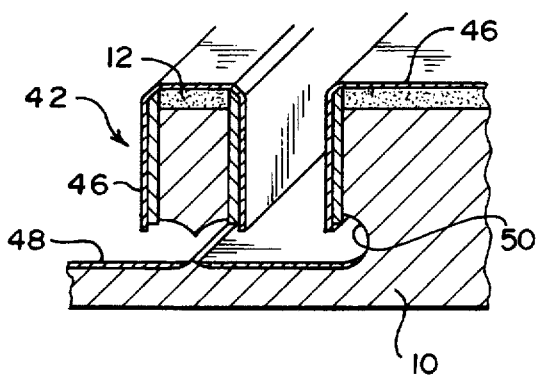
Figure 3:
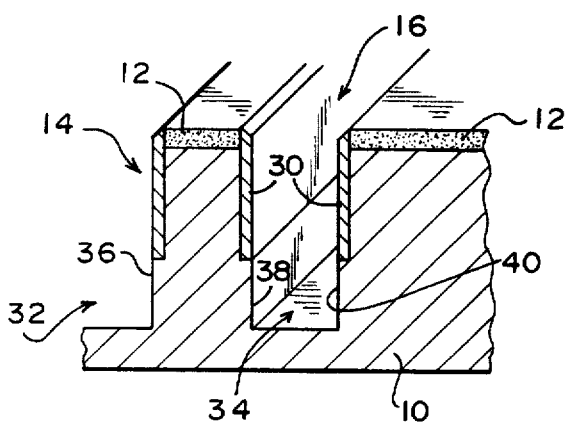

A structure fabricated in accordance with the foregoing process is illustrated in simplified form in FIGS. 1–5, and includes only a single beam adjacent a nearby substrate. However, more complex structures can easily be fabricated using the process described above. Such a structure is illustrated in top plan view in FIG. 6, to which reference is now made. The first lithography step described above defines the complex structural features of the accelerometer of the present invention, generally indicated at 60, and these features are produced within a cavity 62 formed in substrate 64 during the trench etch steps described above. The process produces vertical side walls 66, 68, 70, and 72 for the cavity 62, with the surrounding substrate 64 providing the mechanical support for the fixed sensor portion of the accelerometer, as well as desired circuitry (not shown) for controlling and/or sensing the motion of the movable portion of the accelerometer. The sensor portion is connected to the side walls 68 and 72 of the cavity 62 and includes a pair of support beams 74 and 76, respectively, which are incorporated as a part of the side walls, or which may be cantilevered therefrom to extend inwardly into the cavity 62. Beam 74 is connected to a plurality of stationary fingers 80 through 87, which may be solid mesa structures extending upwardly from the floor of cavity 62, or may be cantilevered, released beams of the type illustrated in FIG. 5. Beams 80–87 extend perpendicularly to support beam 74, are parallel to each other, and their top surfaces lie in a common horizontal plane above the floor of cavity 62. These fingers include a layer of oxide so that the capacitive plates which they carry are electrically isolated from the substrate floor, and the fingers extend toward and terminate near an axial center line of the cavity 62. The beams 80 through 87 are fixed so that they are relatively stiff and inflexible, have a high aspect ratio, and, as illustrated in FIG. 5, are covered with a coating of electrically conductive material such as aluminum to form vertical capacitive plates. The aluminum coating also provides electrical connection between the side wall capacitive plates on each of the beams and an outlet connector pad 88, preferably located on the top surface of substrate 64 and insulated therefrom, as described above.

In similar manner, beam 76 is secured to wall 68 of cavity 62, preferably at a location diametrically opposite to the location of beam 74, with a plurality of laterally extending spaced beams 90–97 extending inwardly from beam 76 toward the center axis of the cavity 62. As with beams 80–87, the beams 90–97 are parallel to each other, have high aspect ratios, and may be mesa structures extending upwardly from the cavity floor, or may be released from the floor so as to be cantilevered to the beam 76. The top surfaces of beams 90–97 lie in the horizontal plane of beams 80–87. Each of the beams 90–97 is covered with a suitable insulating coating and a conductive coating such as aluminum, whereby the side walls of the beams form vertical capacitive plates. Again, the conductive coating on each of the beams 90–97 is connected electrically to an output connector pad 98 on the top surface of substrate 64 by which an electrical connection can be made from the fixed capacitive plates to suitable external electrical circuitry which may be incorporated in the substrate wafer 64 or which may be external thereto.

The accelerometer 60 also includes a movable central mass portion generally indicated at 100 which is fabricated at the same time the inwardly-extending stationary fingers 80–87 and 90–97 are fabricated. The movable portion 100 includes an axially-extending support beam 102 between the terminal ends of the fingers 80–87 and 90–97. Beam 102 serves as a backbone supporting a plurality of laterally outwardly extending fingers 110–117 which are interleaved with the inwardly extending fingers 80–87, and further includes outwardly extending fingers 120–127 interleaved with inwardly extending fixed fingers 90–97. Preferably, fingers 110–117 are laterally opposed to fingers 120–127 and lie in the horizontal plane of fingers 80–87 and 90–97, but it will be apparent that they can be relatively offset, if desired. The outwardly extending fingers are parallel to, and extend substantially the entire length of, the corresponding adjacent inwardly extending fingers, the terminal ends of the outwardly extending fingers terminating near, but just short of, the support beams 74 and 76.

Axial beam 102 and lateral fingers 110–117 and 120–127 may be fabricated in accordance with the process described above with respect to FIGS. 1–5, and thus are released from the underlying substrate 64 for free movement with respect thereto. The movable structure 100, consisting of the axial beam and lateral fingers, is suspended within cavity 62 by movable supports at opposite ends of the structure. Thus, the left-hand end 130, as viewed in FIG. 6, is secured to, or preferably is fabricated integrally with, a laterally extending spring support beam 132 which is flexible in the plane of the accelerometer structure to permit axial motion of beam 102 in the direction of arrow 134. The beam 132 is sufficiently long and its cross-section is selected to provide the degree of flexibility required to enable the accelerometer to respond to selected forces, and is secured at its outermost ends to the substrate adjacent connector pads 136 and 138. The beam 132 serves as a restoring spring which tends to hold the beam 102, and thus the accelerometer moving structure 100, in a predetermined rest position with the opposed fixed and movable fingers spaced apart as required. The spring provides a predetermined resistance to motion, depending upon the dimensions and thus the flexibility of beam 132.

Beam 132 is fabricated in the manner described above with respect to FIGS. 1–5, and is released from the underlying substrate material in the cavity 62 for free motion above the floor of the cavity. The spring support beam is coated with an insulating layer and a conductive material such as aluminum so that it can be connected to external circuitry by way of connector pads 136 and 138, which are insulated from the underlying substrate 64.

In similar manner, the opposite end 140 of beam 102 is connected to a laterally extending spring support beam 142 which serves as a second spring for suspending the movable element 100 in its rest position and for allowing axial motion in the direction of arrows 134. The outermost ends of spring 142 are connected to the substrate 64 adjacent corresponding connector pads 146 and 148 which are insulated from the substrate and are provided with an aluminum or other conductive coating for electrical connection of the beam to suitable external circuitry.

As is illustrated in FIG. 7, which is an expanded view of a portion of the device of FIG. 6, the movable assembly 100 of the accelerometer 60 is made up of a double beam structure to provide extra stiffness and strength to this part of the device. As illustrated, the axial support beam 102, or backbone, consists of two parallel longitudinal beams 160 and 162 joined by a multiplicity of interconnecting bridges 164 which serve as cross-braces. Similarly, each of the laterally extending fingers consists of a pair of parallel, closely-spaced beams such as the beams 166 and 168 illustrated for beam 118 and a multiplicity of cross braces, or bridges 170. This double-beam construction provides a high degree of stiffness for the moving element 100 so that the entire element moves unitarily under accelerating forces without flexure of the beam 102 or the fingers 110–117 or 120–127 to provide accurate measurements of the change of capacitance between opposed plates on the adjacent fixed and movable finger side walls.

Typically, in the microstructure of the present invention, each of the fixed fingers 80–87 and 90–97 is between about 5–15 μm in height depending on whether it is a mesa-type structure or is cantilevered, is about 4 μm in width, and may be 300 or more micrometers in length. If these fingers are cantilevered they preferably are spaced about 2 to 10 μm above the floor of the cavity 62. The spacing between adjacent fingers can be unequal, so that between adjacent fixed and movable fingers at rest, such as fingers 80 and 110, the spacing may be about 2 μm, while the distance between fingers 110 and 81 may be 8 μm. The high aspect ratio individual beams making up the parallel sets of beams in the movable element 100 preferably will be of somewhat thinner than the fixed beams and may be less than 1 μm in width, with a preffered minimum dimension in the range of 1–3 μm, although the total width of the pair of beams for each movable finger may be somewhat greater than the width of a fixed finger. In one form of the invention, as many as 80 individual interleaved capacitor fingers may be provided.

The end return springs 132 and 142 may have the same general thickness and height and thus the same cross-section and aspect ratio as the released fingers. The two return springs are dimensioned to provide the resilience desired for holding the movable element 100 in place, while allowing quick and sensitive response to accelerating forces. The high aspect ratio of the springs insures that they will have greater flexibility in the axial direction indicated by arrows 134, than in the vertical direction, perpendicular to the common plane of the axial beam 102 and the lateral fingers 110–117 and 120–127. In one embodiment of the invention, the stiffness in the axial direction of beam 102 was 0.97 N/m while the out-of-plane stiffness, resulting from the high aspect ratio springs, was 128 N/m.

If desired, an additional masking step, following the process of FIGS. 1–5, can be used to remove the side wall oxide and metal films from the linear springs 132 and 142. Because the lateral spring constant (in the direction of arrows 134 and 144) varies with the cube of the beam width, the removal of the side wall films can reduce the lateral spring constant by up to 2 orders of magnitude. A further control over the spring constant is obtained by varying the width of the spring beams by regulating the width of the silicon.

The capacitor plates on the side walls of the fixed fingers are connected to each other and to connectors 88 and 98, as noted above, while the capacitors formed on the side walls of the movable fingers are connected to each other and through the metal coating on the axial beam 102 and the metallized top surface of spring beam 132 to connector pad 136. The connectors 88, 98 and 136 are connected to suitable circuitry, which may include a source of potential 172, for example, which may be an alternating excitation source. When the structure is subjected to an accelerating force, the movable element 100 shifts with respect to the fixed fingers 80–87 and 90–97, the movable fingers each moving toward or away from the corresponding adjacent fixed fingers. This motion results in a variable capacitance which can be determined by measuring changes in the output voltage at connectors 88 and 98 to determine the displacement of the mass of the movable element 100.

The mass of the movable element 100 preferably is on the order of 1.0 nkg. If it is assumed that the frequency of the accelerating force is significantly lower than the natural frequency of the device, and that the lateral movable fingers and the axial beam 102 are orders of magnitude stiffer than the restoring springs 132 and 142, the change in separation between opposed plates on the fixed and movable fingers can be approximated with a simple spring-mass model and Newton's second law. From this a deformation of 13 nm for an acceleration of 9.8 m/s² can be expected, and since this deformation is small compared to the initial two-micron separation between the capacitor plates, the parallel plate approximation for the capacitance can be accurately expressed using the following equation:

$$C \cong \frac{\epsilon_o A}{d_o} \left[ 1 - \frac{ma}{kd_o} \right] \quad \text{Eq. 1}$$

Where m is the mass of the device, k is the lateral spring constant, A is the area of the plates, $d_o$ is the initial separation, and a is the acceleration. The capacitance may be measured by applying a 100 kHz, 155 mV carrier signal from source 172 through the device. The output current from the pads 88 and 98 is amplitude modulated by the change in capacitance caused by the applied acceleration. The magnitude of the peaks which represent the acceleration is as follows:

$$V_o \cong 1/2 \, \omega_c C_o V_i R_{tr} \left( \frac{ma}{k} \right) \frac{1}{d_o} \quad \text{Eq. 2}$$

Where $V_i$ is the carrier amplitude, $R_{tr}$ is the transresistance, $C_o$ is the DC capacitance, $_{107 \, c}$ is the carrier frequency, k is the spring constant, m is the mass of the device, and a is the acceleration. Experimental data show that the output voltage is linearly related to the acceleration.

Figure 9:
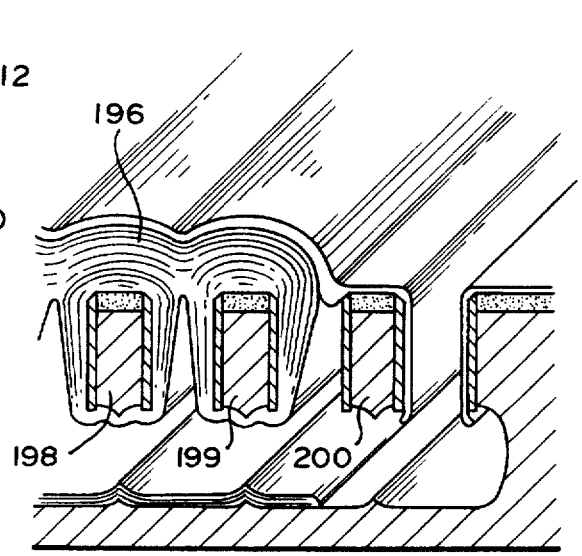
FIG. 9 is a diagrammatic cross-sectional view of a portion of the device of FIG. 8.
Figure 8:
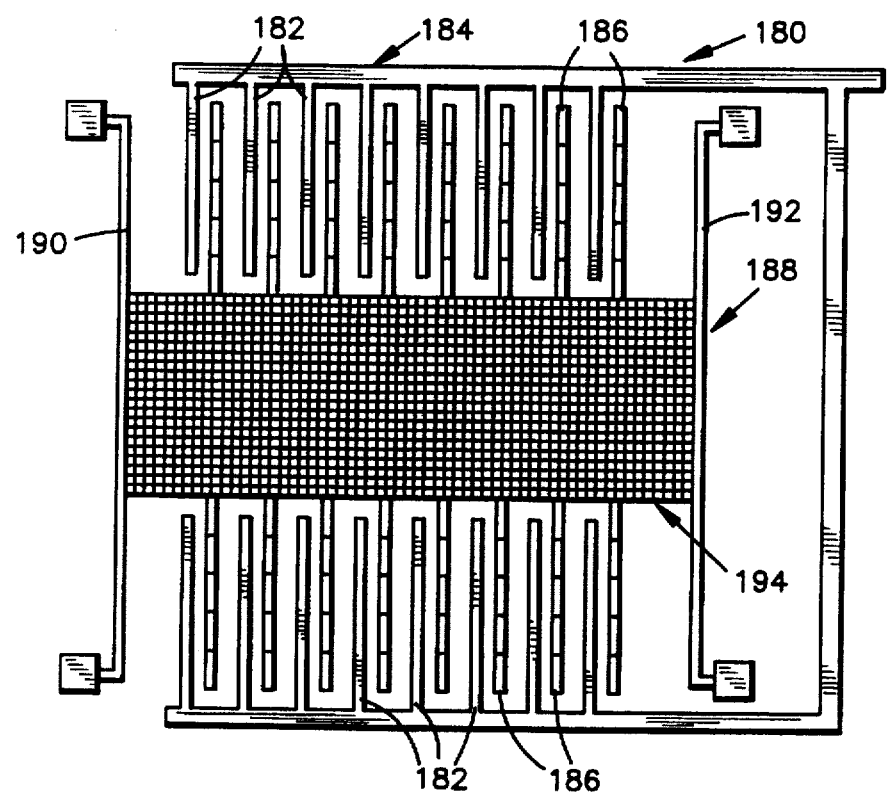
FIG. 8 is a diagrammatic top plan view of a second embodiment of the invention.

Additional mass can be provided for the moving structure 100, if desired, by enlarging the axial beam 102, as illustrated in FIG. 8. In the embodiment there illustrated, accelerometer 180 includes a plurality of fixed fingers 182 extending inwardly from a surrounding substrate, generally indicated at 184. The fingers 182 may extend from both sides of the device, the fingers lying in a common plane and being spaced apart to receive the movable fingers 186 of a movable element generally indicated at 188. The movable element is suspended at its opposite ends by linear springs 190 and 192, in the manner described with respect to FIG. 6, so that the movable fingers 186 lie in the plane of the stationary fingers 182 and are movable in that plane with respect to the stationary fingers. The additional mass is provided by a grid 194 which takes the place of the longitudinal beam 102 in the device of FIG. 6. This grid may be fabricated in the form of a plurality of individual longitudinal beams and lateral spacers, or may be in the form of a plurality of parallel beams covered by a layer of material such as tungsten in the manner illustrated in FIG. 9. As described in the aforesaid Ser. No. 08/013,319, a layer 196 of tungsten may be applied to a plurality of released beams 198, 199, 200, to provide an increased mass, the tungsten covering a selected portion of the grid formed by the underlying beams 198–200, for example, and filling in the inter-beam spaces to produce a thick conformal blanket. The size and thickness of the grid 194 or the layer 196 is selected to provide the mass required for the accelerometer function.

As illustrated in FIG. 8, in order to provide the additional mass required, it may be necessary to widen the spacing between the terminal ends of the fixed fingers on both sides of the accelerometer device. It will be understood that the exact dimensions will be selected in accordance with the sensitivity required for the forces that are to be measured.

The accelerometers illustrated in FIGS. 6, 7, and 8 are referred to as single-ended accelerometers, since motion of beam 102 in either direction along its axis causes the spacing between each of the movable fingers and its corresponding stationary finger to change in the same direction. It will be understood that the device could also sense motion in a vertical direction, toward and away from the floor of cavity 62, by changing the dimensions of the suspension springs 132 and 142 to allow vertical motion. In this case, the movable and fixed fingers would be equally spaced on both sides of each finger, by a distance of, for example, 2 μm.

FIG. 10 illustrates a modified version of the accelerometer which may be referred to as a differential, or double-ended device. As there illustrated, accelerometer 210 includes two stationary portions 212 and 214, both of which interface with corresponding laterally extending fingers forming part of a movable element 216. As illustrated, section 212 has laterally inwardly extending stationary fingers 218 and 220 extending inwardly from opposite sides of the accelerometer and spaced apart to receive interleaved movable fingers 222 and 224, respectively, which extend laterally outwardly from a central, axially extending support beam 226.

In similar manner, the section 214 includes rigid fingers 228 and 230 extending inwardly from opposite sides thereof and interleaved movable fingers 232 and 234 extending laterally outwardly from beam 226. Opposite ends of beam 226 are supported by linear springs 236 and 238, respectively, in the manner described above.

The stationary fingers 218 and 220 are connected to a first outlet connector pad 240 while stationary fingers 228 and 230 are connected to a second outlet connector pad 242. The movable structure 216 is connected to a single voltage supply pad 244.

The movable fingers in section 212 of the accelerometer are on the right-hand side of their corresponding stationary fingers (as viewed in the figure) while the movable fingers in section 214 are mounted on the left-hand side of their corresponding fingers 228. Accordingly, motion of the movable element 216 to the left, as viewed in the figure, causes fingers 218 and 222 to move closer together, while at the same time causing fingers 228 and 232 to move further apart. This provides a differential change in capacitance between the respective plates, and provides a differential voltage change at pads 240 and 242 so as to increase the overall sensitivity of the accelerometer for a given amount of longitudinal motion.

As indicated above, the sensitivity of the accelerometer can be selected by properly dimensioning the thickness, height and length of the suspension springs at the ends of the movable element, but it will be recognized that once fabricated, the mechanical structure will have a fixed natural, or resonant, frequency and a response bandwidth which is limited by the natural frequency of that structure. Thus, the range of input frequencies that the sensor can accurately measure is limited by its mechanical structure. However, in accordance with a further feature of the present invention, a control structure is provided for electrically or electromechanically varying the stiffness of the restoring springs, permitting control of the natural frequency of the device and increasing the range of frequencies that the sensor can accurately measure.

Figure 11:
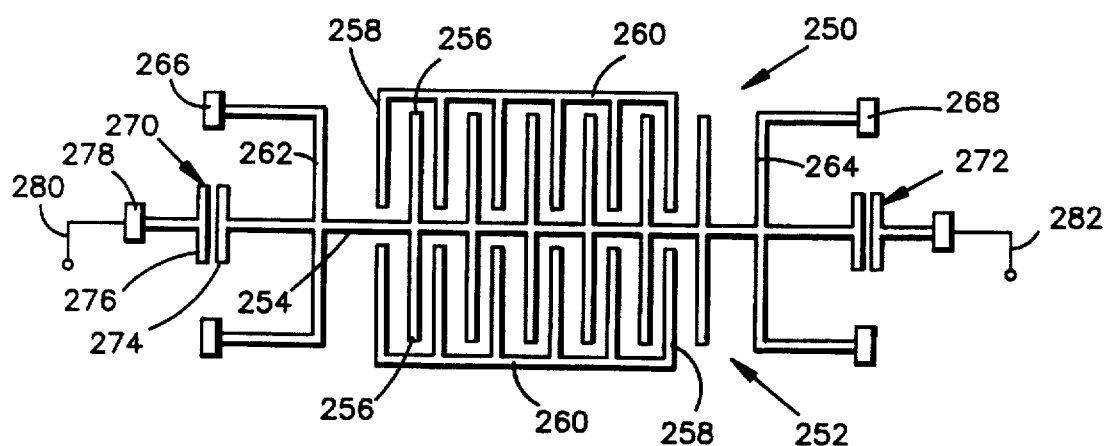
FIG. 11 is a diagrammatic top plan view of a fourth embodiment of the invention, illustrating a control for a restoring spring structure.

One structure for varying the stiffness of the spring and thus the natural frequency of the accelerometer is illustrated in FIGS. 11 and 12. As there illustrated, an accelerometer 250 includes a movable element 252 having an axial support beam 254 carrying a plurality of laterally outwardly extending fingers 256. As discussed above, the fingers 256 are interleaved with inwardly extending stationary fingers 258 mounted as cantilevers on a substrate 260. The support beam 254 is mounted at its opposite ends to laterally extending linear restoring springs 262 and 264, both of which are connected at their outer ends to a fixed support adjacent connector pads such as the pads 266 and 268. Control of the flexibility of springs 262 and 264, and thus of the natural frequency of the structure, is provided by a pair of capacitive drivers 270 and 272, respectively. Driver 270 is illustrated as including a first plate 274 fixed to the return spring 262 and a second, spaced plate 276 fixedly mounted to a support pad 278. The driver is electrically connected by way of pad 278 and a connector line 280 to a suitable source of control voltage. By varying the voltage applied to line 280, the potential across plates 274 and 276 can be varied, thereby controlling the force between these plates and thereby regulating the accelerating force required to enable the movable support beam 254 to move plate 274 with respect to plate 276. Since that such motion is due to the accelerating forces applied to the accelerometer, the voltage applied to line 280 controls the effective stiffness of the spring and thus the sensitivity of the accelerometer.

In similar manner, a voltage applied by way of line 282 to capacitor 272 controls the stiffness of spring 264.

The voltages applied to the two drivers 270 and 272 can be used to reduce the stiffness of the springs 262 and 264 by selecting the voltages to oppose each other so that a force is applied to one of the drivers to move spring 262 to the left, and a force is applied to the other capacitor to move spring 264 to the right. If an accelerating force initiates motion of the structure toward the left, for example (see FIG. 12), the capacitance of capacitor 270 will increase and that of capacitor 272 will decrease. As a result, the new force on the element 252 due to the voltage applied to capacitors 270 and 272 will be towards the left, and this will aid the accelerating force, thereby producing a net reduction in the external force required to shift the movable fingers 256 with respect with the stationary fingers 258. This increases the sensitivity of the device and decreases the natural frequency.

Although drivers 270 and 272 are illustrated as parallel plate capacitors, it will be understood that finger or comb-type capacitors can also be substituted for the plate-type capacitors to control the motion of the springs.

An increase in the stiffness of the support springs can be obtained in the manner illustrated in FIG. 13 wherein an accelerometer 290 includes a movable element 292 having laterally outwardly extending fingers 294 extending from a central, axially extending support beam 296. Beam 296 is connected at its opposite ends to laterally extending linear suspension springs 298 and 300 which are fixed at their outer ends and which are flexible to permit longitudinal motion of beam 296 and corresponding motion of the fingers 294 with respect to stationary interleaved fingers (not shown). To increase the stiffness of the springs 298 and 300, a pair of control capacitors 302 and 304 are provided. In this embodiment, capacitor 302 includes a first comb-shaped plate 306 connected to the movable element 292 and a second, opposed comb-shaped plate 308 connected to a fixed pad 310 on the substrate in which the accelerometer is mounted. Capacitor 304 is similarly constructed.

A force applied to the accelerometer to cause the movable element 292 to shift towards the left (as viewed in FIG. 13) will cause plate 306 to shift towards the left with respect to the fixed plate 308. A voltage applied across those plates will tend to restore the plate 306 to its rest position (illustrated in the figure). The greater the accelerating force applied to the movable element 292, the greater the displacement of plate 306 with respect to plate 308. By controlling the voltage applied across the plates the restoring force can be controlled to provide the desired effective stiffness for the springs 298 and 300. The minimum voltage required to hold the movable element 292 in place is a measure of the accelerating force applied to that element.

Figure 14:
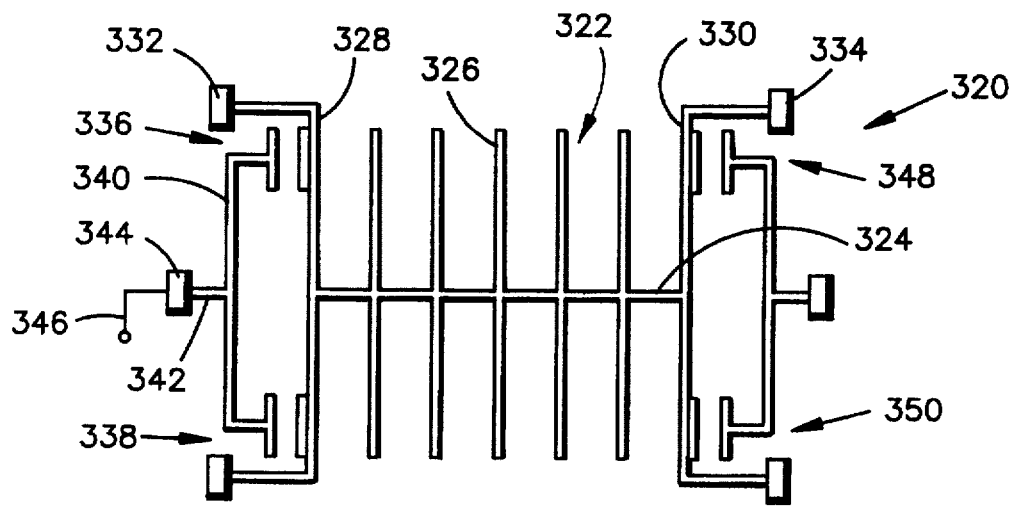
FIG. 14 is a diagrammatic top plan view of a sixth embodiment of the invention, illustrating another modified control structure.
Figure 15:
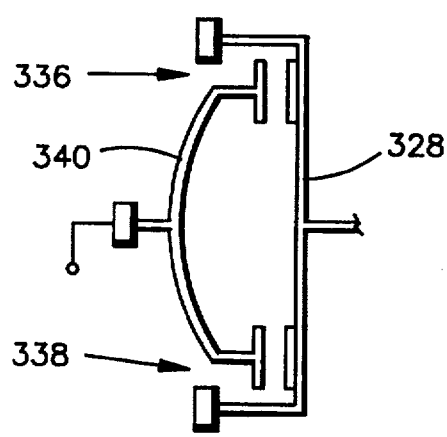
FIG. 15 is a diagrammatic partial top plan view of the embodiment of FIG. 14, with the control activated.

FIGS. 14 and 15 illustrate an electromechanical method for increasing the stiffness of the return springs for the accelerometer. As there illustrated, the accelerometer 320 includes a movable portion 322 having, as before, an axial support beam 324 and a plurality of laterally outwardly extending fingers 326. The opposite ends of the beam 324 are supported by laterally extending linear suspension springs 328 and 330 which are supported at their outermost ends on fixed pads such as the pads 332 and 334. Adjacent each of the springs 328 and 330 is a pair of clamping capacitors such as the capacitors 336 and 338 adjacent spring 328. These two capacitors are mounted on a flexible support beam 340 which is, in turn, mounted at its center by way of arm 342 to a fixed pad 344. A voltage may be applied to the two capacitors 336 and 338 by way of an input line 346 and electrically conductive coatings on pad 344 and beams 340 and 342. An application of a suitable voltage draws the plates of capacitors 336 and 338 together, as illustrated in FIG. 15, thereby bending the support beam 340 and effectively connecting beams 340 and 328 in parallel to thereby mechanically change the flexibility of beam 328. In similar manner, the flexibility of beam 330 can be changed by the application of a voltage to capacitors 348 and 350 which are constructed in a manner similar to that of capacitors 336 and 338. After the capacitors for both beams 328 and 330 are clamped, the system becomes stiffer and the natural frequency increases, with a consequent decrease in sensitivity. It will be understood that a layer of insulation will be included between the plates of the clamping capacitors and the restoring springs 328 and 330 to prevent sticking and to prevent short circuits.

Figure 16:
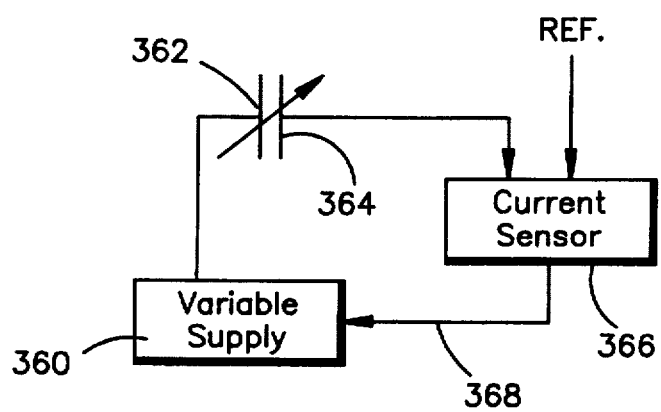
FIG. 16 is a diagrammatic illustration of a feedback control system for the present invention.

In each of the embodiments illustrated herein, an active feedback system may be incorporated to measure the capacitance between the plates on the fixed and movable fingers caused by relative motion of the plates and to provide a feedback voltage that can be applied to restore the movable fingers to their rest position. The feedback voltage is a measure of the applied force. In such a system, the change in capacitance due to the applied force is measured by the current flow through the plates, for example, and this value is used to adjust the voltage applied to the movable element to thereby hold the movable element at its rest position with respect to the fixed structure. The feedback voltage varies instantaneously with changes in the applied force, so the movable element does not move, with the result that errors due to nonlinearities caused by relative motion of the parts is eliminated, and the accuracy and sensitivity of the system is increased. Such a feedback system is illustrated diagrammatically in FIG. 16 where a variable voltage supply 360 supplies potential to the movable plates 362 of the accelerometer. The current flow between the variable plates 362 and the stationary plates 364 is measured by a current sensor 366 and compared to a reference value. A difference signal is applied by way of line 368 to regulate the variable supply 360 to maintain a predetermined spacing between the fixed and movable plates. The value of the signal on line 368 may be used to determine the value of the accelerating force applied to the movable plates 362. Such a system can be used, for example, to provide a feedback voltage to maintain the alignment of capacitor plates 306 and 308 in FIG. 13, or to control the voltages applied to capacitors 270 and 272 in FIG. 11.

Although the foregoing discussion has been directed to variations of capacitance caused by motion of the movable element; for example, element 100 in FIG. 6, in the plane of the capacitor plates, it will be understood that motion perpendicular to that plane can also be measured, since there is a capacitance between the capacitor plates carried by the moving fingers and the underlying substrate or a metal layer or that substrate. This is illustrated in FIG. 5, where metal layer 48 can serve as a ground plate with respect to the metal layer 46 on the beam 42. The capacitance between these metal layers can be used to detect motion perpendicular to the plane of the fingers so that the accelerometer is three dimensional. Although the layer 48 is shown as being on the semiconductive substrate 10, it will be understood that an insulating layer can be provided on the floor of the trenches before the metal layer is applied so as to insulate layer 48 from the underlying substrate.

Although the present invention has been disclosed in terms of preferred embodiments, it will be understood that modifications and variations can be made without departing from the true spirit and scope thereof, as set forth in the following claims.

What is claimed is:

1. A micromechanical accelerometer comprising:

a support beam having an elongated axis and being axially movable in response to applied forces to be measured;

a plurality of laterally extending, spaced, parallel fingers extending from and carried by said support beam and movable with said beam;

a flexible restoring spring connected to and carrying said elongated support beam, said spring allowing axial motion of said axially movable support beam and urging said support beam toward a rest position, said movable beam, said movable fingers and said spring having high aspect ratios with minimum dimensions in the range of 1–3 micrometers; and a controller for said flexible restoring spring to regulate the force applied by said spring to said support beam.

2. The accelerometer of claim 1, wherein said controller includes means for applying a capacitive force to said restoring spring for varying the flexibility of said restoring spring.

3. The accelerometer of claim 1, further including sensor means adjacent said lateral fingers for detecting motion of said elongated support beam and said lateral fingers.

4. The accelerometer of claim 3, wherein said sensor means includes a plurality of parallel fixed fingers interleaved with said movable fingers.

5. The accelerometer of claim 4, further including electrically conductive means on said fixed and said movable fingers to form capacitors variable in response to relative motion of said fixed and movable fingers.

6. The accelerometer of claim 4, wherein said interleaved fixed and movable fingers lie in a common plane, said fixed and movable fingers having opposed corresponding vertical surfaces, said accelerometer further including electrically conductive layers on at least selected parts of said opposed vertical surfaces to provide corresponding capacitors variable in response to relative motion of said fixed and movable fingers.

7. A microelectromechanical accelerometer, comprising:

a support beam having an elongated axis and being axially movable in response to applied forces to be measured;

a plurality of laterally extending, spaced parallel fingers extending from and carried by said support beam and movable with said beam, said support beam and said fingers each having a double-beam structure with interconnecting bridges to provide a high degree of stiffness; and a flexible restoring spring connected to and carrying said elongated support beam, said spring allowing axial motion of said axially movable support beam and urging said support beam toward a rest position, said movable beam, said movable fingers, and said spring having high aspect ratios with minimum dimensions in the range of 1–3 μm.

8. The accelerometer of claim 7, wherein each beam of said double beam structure has a high aspect ratio with a width of between 1 and 3 micrometers and a height of about 10 micrometers.

9. The accelerometer of claim 8, wherein each beam of said double beam structure has a height in the range of 5–15 micrometers.

10. The accelerometer of claim 8, further including control means for said flexible restoring spring to regulate the force applied by said spring to said support beam.

11. The accelerometer of claim 10, wherein said control means includes clamping means for varying the flexibility of said restoring spring.

12. A microelectromechanical accelerometer, comprising:

a single crystal silicon substrate;

a support beam having an axis, said beam being fabricated from said substrate and being released from said substrate so as to be axially movable with respect to said substrate in response to applied forces to be measured; and a cantilevered restoring spring fabricated from said substrate and connected between said support beam and said substrate, said spring allowing axial motion of said support beam and urging said beam toward a rest position, said support beam and said restoring spring having respective cross-sectional heights greater than their respective cross-sectional widths to provide a high aspect ratio beam and a high aspect ratio spring having flexibility in a first direction and stiffness in a second direction.

13. The accelerometer of claim 12, wherein said support beam and said restoring spring lie in a common plane, said spring mounting said beam for axial motion in said plane, said first direction of flexibility for said beam and said spring being in said common plane and said second direction of stiffness for said beam and said spring being in a direction perpendicular to said common plane.

14. The accelerometer of claim 13, wherein said high aspect ratio is about 10:1.

15. The accelerometer of claim 12, wherein said beam has first and second ends, said flexible restoring spring being connected to said first end to permit said beam to move along said axis in said first direction.

16. The accelerometer of claim 12, wherein said support beam and said restoring spring are fabricated from said single crystal silicon substrate by the process of:

depositing an oxide layer on said substrate;

forming in said layer a pattern mask exposing the surface of said substrate in a pattern defining said support beam and restoring spring;

etching by a deep reactive ion vertical etch on said exposed substrate surface trenches having vertical side walls defining beneath said pattern mask a structure of said support beam and said restoring spring;

protecting said vertical side walls;

deepening said trenches to expose sidewall substrate single crystal silicon beneath said defined structure; and etching said exposed sidewall substrate single crystal silicon to release said defined structure, leaving said support beam supported on said substrate solely by said restoring spring.

17. The accelerometer of claim 16, wherein said support beam comprises an elongated backbone and plural laterally extending fingers integral with, coplanar with, and movable with said backbone, and further including plural laterally extending fixed fingers integral with said substrate and coplanar with said backbone, said movable and fixed fingers having corresponding opposed surfaces.

18. The accelerometer of claim 17, further including depositing a metal layer on said opposed surfaces to thereby form opposed capacitor plates.

19. The accelerometer of claim 18, further including electrically connecting said capacitor plates to sensor circuit means for sensing relative motion between said beam and said substrate.

20. The accelerometer of claim 12, further including a second flexible restoring spring connected to said second end of said beam to permit said beam to move along said axis.

21. The accelerometer of claim 20, wherein each of said flexible restoring springs is a linear flexible beam integral with said support beam, extending laterally therefrom, and having outer ends fixedly supported, whereby said springs position said support beam and said movable fingers with respect to said substrate and permit axial motion of said support beam.

22. The accelerometer of claim 21, further including control means for varying the flexibility of said support springs.

15

23. The accelerometer of claim 21, further including control means for regulating the motion of said support beam and springs.

24. The accelerometer of claim 23, wherein said control means includes a feedback system.

25. The accelerometer of claim 18, wherein said control means includes clamping means for mechanically changing the flexibility of said springs.

26. The accelerometer of claim 18, wherein said control means includes capacitor means connected to regulate the motion of said support beam and springs.

27. The accelerometer of claim 12, wherein said support beam comprises an elongated backbone incorporating first sensor means integral with and movable with said backbone and fabricated from said substrate.

28. The accelerometer of claim 27, further including second sensor means integral with said substrate and coupled with said first sensor means for detecting relative motion between said support beam and said substrate.

29. The accelerometer of claim 28, wherein said first and second sensor means comprise opposed movable and stationary capacitor plates, respectively.

30. The accelerometer of claim 28, further including a additional proof mass carried by said backbone and integral fingers.

31. The accelerometer of claim 28, wherein said restoring spring is fabricated from said substrate to have a predetermined spring constant, whereby said support beam has a known resonance frequency.

32. The accelerometer of claim 31, further including means for electromechanically adjusting said spring constant to vary the resonance frequency of said support beam.

33. The accelerometer of claim 28, wherein said first sensor means comprises plural first fingers extending from said backbone and said second sensor means comprises plural fixed second fingers extending from said substrate, said first fingers being movable with said backbone to be relatively movable with respect to said second fingers.

34. The accelerometer of claim 21, wherein said movable fingers and said fixed fingers are interleaved to provide a single-ended accelerometer.

35. The accelerometer of claim 21, wherein said movable and fixed fingers are interleaved to provide a differential accelerometer.

36. The accelerometer of claim 33, further including:
a first metal layer on each of said plural first fingers and a second metal layer on each of said plural second fingers, the metal layers on respective first and second fingers being opposed to provide opposite plates of a sensing capacitor;
electrical contact pads on said substrate; and
metal layers on said substrate connecting said plates to said contact pads to permit connection of said sensing capacitor to sensing circuitry.

37. The accelerometer of claim 36, wherein each of said plural first fingers integral with said backbone has a high aspect cross-sectional height to width ratio to provide a vertical wall on each finger to receive said metal layer.

38. The accelerometer of claim 37, wherein said high aspect ratio is at least about 10:1.

39. The accelerometer of claim 36, wherein said substrate is an integrated circuit wafer, and wherein said contact pads are provided on said wafer for connecting said plates to integrated circuits on said wafer.

40. The accelerometer of claim 33, wherein said first fingers are fabricated to have less flexibility than said spring in said first direction.

16

41. The accelerometer of claim 33, wherein said first fingers have a width of about 1 μm, and an aspect ratio of about 10:1.

42. The accelerometer of claim 41, wherein said first fingers are single crystal silicon with a conformed layer of metal.

43. The accelerometer of claim 1, wherein said movable beam, said movable fingers and said spring are single crystal silicon.

44. A highly sensitive, microelectromechanical force detector having extremely small dimensions fabricated on an integrated circuit wafer containing electrical circuitry connectable to the detector, comprising:
a single crystal silicon wafer carrying a pre-existing circuit element;
a movable beam fabricated from said single crystal silicon wafer and released from said wafer for motion with respect to said wafer, said beam incorporating an elongated backbone and integral laterally extending first sensor fingers having a high aspect ratio;
a cantilevered spring integral with said wafer and supporting said beam for motion, said spring urging said beam toward a rest position;
second high aspect ratio sensor fingers integral with said wafer, corresponding first and second fingers having opposed side walls;
a conformed electrically conductive layer on said opposed finger side walls to provide capacitive plates; and
electrically conductive connectors between said plates and said circuit elements for connecting said plates to circuitry for detecting relative motion between said beam and said wafer.

45. The detector of claim 44, wherein said circuitry includes an active feedback circuit for supplying a feedback voltage for restoring said movable beam to said rest position.

46. An accelerometer formed by low temperature reactive ion etching comprising:
a base comprising single crystal silicon;
a proof mass responsive to an applied acceleration vector along an axis of sensitivity, said proof mass formed by defining one or more integral beams from said base by a vertical reactive ion etch followed by an isotropic etch for removing the silicon out from under said one or more beams, thereby releasing them for movement;
a mount connecting said one or more integral beams with said base for constraining said proof mass to move along the axis of sensitivity in response to the applied acceleration vector and for restoring said proof mass to an equilibrium position;
a transducer for converting the movement of said proof mass to a signal representative of said applied acceleration vector, said transducer formed by providing a layer of conductive material over one or more of said integral beams and over an adjacent corresponding vertical wall of said base so that a parallel plate capacitor is formed between said one or more of said beams and the corresponding adjacent wall of said base, whereby movement of said proof mass relative to said base provides a change in capacitance; and
signal conditioning circuitry responsive to said change in capacitance for converting said change in capacitance to a signal representative of said applied acceleration.

47. An accelerometer comprising:
a wafer of single crystal silicon having a major face;
a proof mass formed by defining a selected region in said major face and etching vertically downwardly using a low temperature reactive ion etch, and undercutting a portion of the wafer underlying the proof mass with an isotropic release etch for releasing said proof mass to move in response to an applied acceleration vector along an axis of sensitivity, said proof mass characterized by a major surface having a high aspect ratio formed by said vertical reactive ion etch; and a transducer for converting movement of the proof mass in response to an applied acceleration vector and for producing an output signal representative of the magnitude of said acceleration vector.

48. An apparatus as in claim 47, further comprising a spring means for connecting the proof mass to the wafer for returning the proof mass to an equilibrium condition.

49. An apparatus according to claim 47, wherein said transducer is formed by providing a layer of conductive material over said high aspect ratio surface of said proof mass and over an adjacent side wall of said wafer to thereby provide adjacent capacitor plates characterized by a large surface area for maximizing a capacitance developed between said plates.

50. An apparatus according to claim 47 wherein the major surface of the proof mass is characterized by a high aspect ratio having a range of from 5:1 to 20:1.

51. An accelerometer comprising:

a wafer comprising single crystal silicon;

a proof mass for moving along an axis of sensitivity in response to an applied input acceleration vector, said proof mass formed by a vertical reactive ion etch of said wafer to form one or more beams with vertical side walls, each beam side wall disposed adjacent to a corresponding vertical wall of the wafer, said beams being undercut with an isotropic etch to release a sufficient portion of the beam from the wafer for movement in the axis of sensitivity in response to said applied input acceleration vector;

a transducer formed by coating the vertical side wall of said one or more beams and the adjacent corresponding vertical wall of said wafer with a conductive material to provide adjacent capacitor plates for producing a differential capacitance upon relative motion of the proof mass in response to an applied acceleration vector; and wherein the one or more beams of the proof mass are characterized by high aspect ratio surfaces exhibiting stiffness and insensitivity to acceleration vectors which are not parallel to the axis of sensitivity.

52. An accelerometer according to claim 51 further comprising a return spring coupled between said proof mass and said wafer, said return spring biased to constrain the movement of the proof mass to respond to an input acceleration vector of a predetermined threshold and for returning the proof mass to equilibrium.

* * * * *

UNITED STATES PATENT AND TRADEMARK OFFICE
CERTIFICATE OF CORRECTION

PATENT NO. : 5,563,343
DATED : October 8, 1996
INVENTOR(S) : Kevin A. Shaw et al.

It is certified that error appears in the above-indentified patent and that said Letters Patent is hereby corrected as shown below:

Column 15:

Claim 25, line 1, change "18" to --23--.

Claim 26, line 1, change "18" to --23--.

Claim 34, line 1, change "21" to --33--.

Claim 35, line 1, change "21" to --33--.

Signed and Sealed this

Tenth Day of December, 1996

Attest:

BRUCE LEHMAN

Attesting Officer

Commissioner of Patents and Trademarks